(12) United States Patent
Chan

(10) Patent No.: US 9,377,918 B2
(45) Date of Patent: Jun. 28, 2016

(54) METHOD AND APPARATUS FOR FORMING PATTERNS IN COATINGS ON OPPOSITE SIDES OF A TRANSPARENT SUBSTRATE

(71) Applicant: M-SOLV LIMITED, Oxford, Oxfordshire (GB)

(72) Inventor: Yuk Kwan Chan, Oxford (GB)

(73) Assignee: M-SOLV LIMITED, Oxford (GB)

( * ) Notice: Subject to any disclaimer, the term of this patent is extended or adjusted under 35 U.S.C. 154(b) by 0 days.

(21) Appl. No.: 14/762,586

(22) PCT Filed: Jan. 9, 2014

(86) PCT No.: PCT/GB2014/050053
§ 371 (c)(1),
(2) Date: Jul. 22, 2015

(87) PCT Pub. No.: WO2014/114908
PCT Pub. Date: Jul. 31, 2014

(65) Prior Publication Data
US 2015/0370374 A1 Dec. 24, 2015

(30) Foreign Application Priority Data
Jan. 22, 2013 (GB) .................................. 1301100.2

(51) Int. Cl.
*H05K 1/03* (2006.01)
*G06F 3/044* (2006.01)
(Continued)

(52) U.S. Cl.
CPC ............ *G06F 3/044* (2013.01); *B23K 26/0063* (2013.01); *B23K 26/0619* (2015.10);
(Continued)

(58) Field of Classification Search
CPC ............. H05K 3/02; H05K 3/12; H05K 3/46; H05K 3/78; H01L 21/30; H01L 21/66; H01L 21/301; H01L 21/762; B05D 3/06; B23K 26/00; B23K 26/40

USPC .................. 174/255; 438/346, 458, 636, 795; 427/555, 596; 29/847
See application file for complete search history.

(56) References Cited

U.S. PATENT DOCUMENTS 5,367,980 A * 11/1994 Itom ................. H01L 21/30621
117/108
5,702,565 A 12/1997 Wu et al.
(Continued)

FOREIGN PATENT DOCUMENTS

CN 102357736 A 2/2012
EP 0938135 A2 8/1999
(Continued)

*Primary Examiner* — Xiaoliang Chen
(74) *Attorney, Agent, or Firm* — Harness, Dickey & Pierce, P.L.C.

(57) ABSTRACT

A method of forming patterns in coatings on opposite sides of a transparent substrate by direct write laser patterning comprising the steps: a) providing a first transparent coating on a first side of the substrate, the first coating being formed of a material having a relatively high laser ablation threshold energy density; b) mounting the substrate on a stage or locating the substrate on a chuck, c) using a first laser beam to form a first pattern in the first transparent coating by laser ablation; d) providing a second transparent coating on the second side of the substrate after formation of said first pattern, the second coating being formed of a material having a relatively low laser ablation or modification threshold energy density; using a second laser beam to form a second pattern in the second transparent coating by laser ablation or modification, the energy density of the second laser beam being lower than that of the first laser beam such that ablation of the second transparent coating is carried out without causing appreciable damage to the first transparent coating. Apparatus arranged to carry out this method and a product formed by the method are also described.

30 Claims, 7 Drawing Sheets

(51) Int. Cl.
- *B23K 26/00* (2014.01)
- *B23K 26/18* (2006.01)
- *B23K 26/36* (2014.01)
- *B23K 26/40* (2014.01)
- *H05K 1/02* (2006.01)
- *H05K 3/02* (2006.01)

(52) U.S. Cl.
CPC ............... *B23K26/18* (2013.01); *B23K 26/36* (2013.01); *B23K 26/362* (2013.01); *B23K 26/40* (2013.01); *B23K 26/402* (2013.01); *B23K 26/702* (2015.10); *H05K 1/0274* (2013.01); *H05K 1/0296* (2013.01); *H05K 3/027* (2013.01); *B23K 2201/35* (2015.10); *H05K 2201/0108* (2013.01)

(56) References Cited

U.S. PATENT DOCUMENTS

| | | | |
|---|---|---|---|
| 6,466,407 B1* | 10/2002 | Brand | G11B 5/102 360/235.1 |
| 6,858,461 B2 | 2/2005 | Oswald et al. | |
| 8,609,205 B2* | 12/2013 | Hu | C23C 14/083 427/596 |
| 8,881,388 B2* | 11/2014 | Milne | B23K 26/0621 219/121.67 |
| 2003/0085208 A1 | 5/2003 | Umetsu et al. | |
| 2004/0027516 A1* | 2/2004 | Liu | G02F 1/133555 349/113 |
| 2004/0228004 A1* | 11/2004 | Sercel | B23K 26/0608 359/668 |
| 2005/0199597 A1* | 9/2005 | Tsao | B23K 26/03 219/121.66 |
| 2007/0039395 A1* | 2/2007 | Gupta | C03C 17/34 73/800 |
| 2010/0015558 A1* | 1/2010 | Jarvis | B41M 5/267 430/346 |
| 2011/0006999 A1 | 1/2011 | Chang et al. | |
| 2011/0236597 A1* | 9/2011 | Chan | G06F 3/044 427/555 |
| 2011/0306180 A1* | 12/2011 | Prabhakar | H01L 21/268 438/458 |
| 2012/0207952 A1 | 8/2012 | Walp | |
| 2013/0244449 A1* | 9/2013 | Baird | B23K 26/0732 438/795 |

FOREIGN PATENT DOCUMENTS

| | | |
|---|---|---|
| EP | 2369452 A2 | 9/2011 |
| GB | 2457720 A | 8/2009 |
| GB | 2472613 A | 2/2011 |
| GB | 2487962 A | 8/2012 |
| WO | WO-2008-119949 A1 | 10/2008 |
| WO | WO-2011-048347 A1 | 4/2011 |

\* cited by examiner

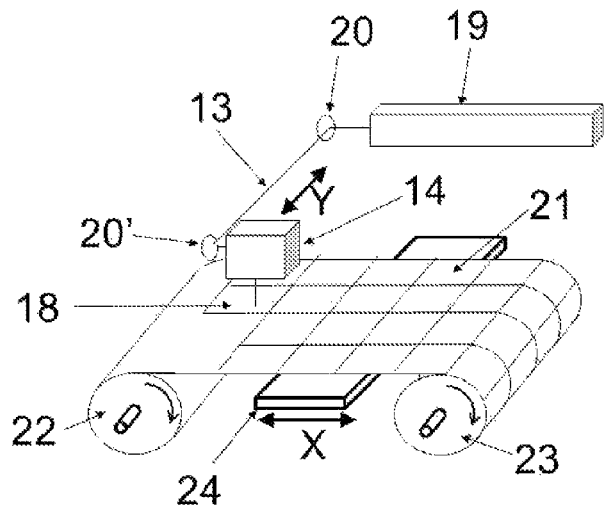
Figure 7
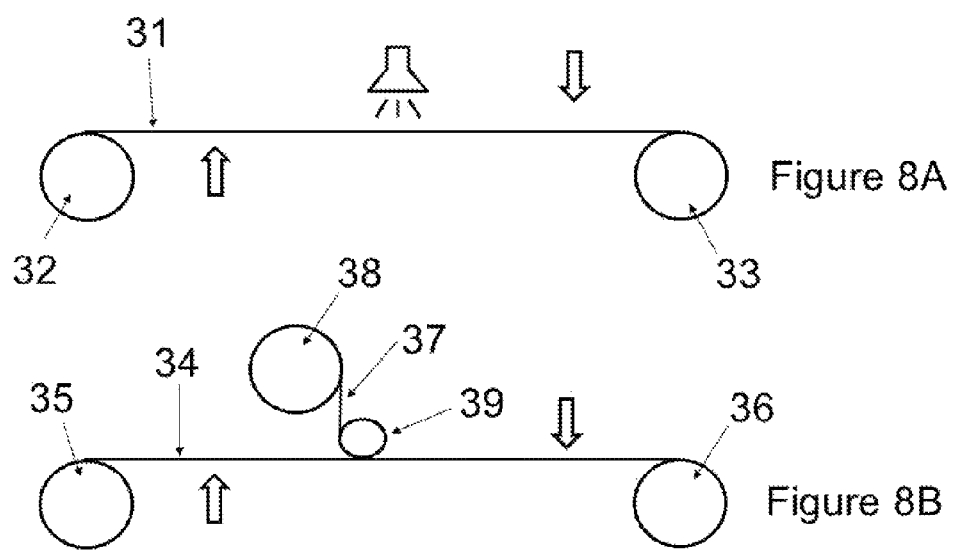
Figure 8A
Figure 8B

METHOD AND APPARATUS FOR FORMING PATTERNS IN COATINGS ON OPPOSITE SIDES OF A TRANSPARENT SUBSTRATE

CROSS-REFERENCE TO RELATED APPLICATIONS

This application is a 371 U.S. National Stage of International Application No. PCT/GB2014/050053, filed Jan. 9, 2014, which claims priority to and the benefit of British Patent Application No. 1301100.2, filed Jan. 22, 2013. The disclosures of the above applications are incorporated herein by reference.

FIELD OF THE INVENTION

This invention relates to a method and apparatus for forming patterns in coatings on opposite sides of a transparent substrate, in particular in the manufacture of a two-layer capacitive touch sensor, and to a product made by the method.

BACKGROUND ART

There is a great desire to incorporate capacitive touch sensors with multi touch capability into hand held devices such as mobile smart phones, MP3 players, PDAs, tablet PCs, etc. Such devices often have a transparent front cover sheet that is made of glass or plastic onto the rear of which a two-layer transparent capacitive sensor is bonded. Such an arrangement can lead to a cover/sensor module that is undesirably thick and heavy and hence there is to a requirement to reduce the thickness of the 2-layer sensor as far as possible while still retaining good projected touch performance. Sensor thicknesses of 0.2 mm or less are desirable.

Prior art in the 2-layer sensor area generally involves making the transmit (Tx) and receive (Rx) electrode layers on separate substrates and then laminating them together. The two substrates for the sensor are generally made of plastic. In this case, to make a laminated 2-layer sensor with overall thickness or 0.2 mm or less would require use of polymer substrates of around 0.075 mm or 0.05 mm thickness which are difficult to handle.

Other prior art in the 2-layer sensor area involves depositing two similar transparent electrically conducting (TC) layers on the opposite faces of a single transparent glass substrate and then creating the Tx and Rx electrodes in the layers using direct write laser patterning. However, this process is limited in minimum substrate thickness as problems with the laser beam patterning the TC on one side damaging the TC on the other become very severe with glass substrate thicknesses less than about 0.4 mm.

Patterning of the TC layers on 2-layer touch sensors is generally carried out using lithography processes involving application of resist, exposure through a mask, resist development, chemical etching of the TC layer and finally resist stripping. Such multi-step processes which have to be repeated for every material layer requiring patterning have a high cost associated with them as large quantities of capital equipment are needed and large amounts of chemicals are required. A major factor contributing to the high cost of ownership is that for each sensor design special costly masks are required for every layer to be patterned. Laser direct write patterning overcomes all these drawbacks and hence there is a strong desire to use laser patterning processes but at the same time be able to make a 2-layer sensor on a single thin substrate. The two layers are provided on opposite sides of the substrate and are thus both exposed (rather than be covered by a further layer and thus sandwiched between two layers).

The present invention aims to address the above problems by providing a method and apparatus for direct write laser patterning coatings on opposite sides of a substrate without appreciable damage to the first coating when the pattern in the second coating is being formed.

DISCLOSURE OF INVENTION

According to a first aspect of the present invention, there is provided a method of forming patterns in coatings on opposite sides of a transparent substrate, the substrate having first and second faces on opposite sides thereof, by direct write laser patterning comprising the steps:
a) providing a first transparent coating on the first side of the substrate, the first coating being formed of a material having a relatively high laser ablation threshold energy density;
b) mounting the substrate on a stage or locating the substrate on a chuck,
c) using a first laser beam to form a first pattern in the first transparent coating by laser ablation;
d) providing a second transparent coating on the second side of the substrate after formation of said first pattern, the second coating being formed of a material having a relatively low laser ablation or modification threshold energy density;
using a second laser beam to form a second pattern in the second transparent coating by laser ablation or modification, the energy density of the second laser beam being lower than that of the first laser beam such that ablation of the second transparent coating is carried out without causing appreciable damage to the first transparent coating.

According to a second aspect of the invention, there is provided apparatus for forming patterns in first and second transparent coatings provided on opposite sides of a transparent substrate by direct write laser patterning, the substrate having first and second sides on opposite faces thereof, the apparatus comprising:
a stage on which the substrate can be mounted or a chuck on which the substrate can be located;
a first laser source arranged to provide a first laser beam for forming a first pattern in the first transparent coating on the first side of the substrate by laser ablation; and
a second laser source arranged to provide a second laser beam to form a second pattern in the second transparent coating on the second side of the substrate by laser ablation or modification,
the energy density of the second laser beam being lower than that of the first laser beam such that ablation of the second transparent coating can be carried out without causing appreciable damage to the first transparent coating.

The invention also relates to such apparatus in combination with a transparent substrate having a first transparent coating on a first side thereof, the first coating being formed of a material having a relatively high laser ablation threshold energy density and second transparent coating on a second side of the substrate, the second coating being formed of a material having a relatively low laser ablation or modification threshold energy density.

The invention further relates to the use of apparatus as detailed above for carrying out the method detailed above.

According to a further aspect of the invention, there is provided a product formed by a method as described above comprising a transparent substrate having first and second patterns formed in first and second transparent electrically conductive coatings on first and second sides thereof by direct write laser patterning, the first and second coatings being formed of different materials, the first coating being formed of a material having a relatively high laser ablation threshold energy density and the second coating being formed of a material having a relatively low laser ablation or modification threshold energy density.

The present invention thus enables direct write laser patterning of coatings on opposite sides of a thin substrate without appreciable damage to a first coating on one side of the substrate when a pattern is formed by direct write laser patterning in the second coating on the other side of the substrate. Both of these coating are exposed when the laser patterning takes place so they are free to expand and vaporize during laser ablation. Their ablation characteristics are thus very different from those of a layer which is sandwiched between other layers (so is not free to expand). The back pressure exerted by such overlying layer(s) tends to substantially raise the ablation threshold.

The term 'substrate' has its conventional meaning, ie it is an initial layer which provides a base on which other material can be deposited (for subsequent patterning etc). In this context, a 'thin substrate' is a single layer substrate which is transparent and whose thickness is not sufficient to protect the first coating (present on a first side of the substrate) when a laser having an energy density similar to that used to form a pattern in the first coating is used to form a pattern in the second coating (on the opposite side of the same substrate) yet is of a thickness such that it can act as a base on which other material can be deposited.

The substrate preferably has a thickness of at least 0.05 mm and less than 0.5 mm, and preferably less then 0.2 mm.

Other preferred and optional features of the invention will be apparent from the subsidiary claims of the specification and the following description.

BRIEF DESCRIPTION OF DRAWINGS

The invention will now be further described, merely by way of example, with reference to the accompanying drawings in which:

FIG. 7 is a schematic perspective view illustrating another way of moving such apparatus relative to a substrate;

FIGS. 8A and 8B are schematic diagrams of other forms of apparatus for carrying out a method according to the invention;

The invention is described with specific reference to its use in the manufacture of electrodes for a two-layer capacitive touch sensor panel but it may also be used in other applications requiring the formation of patterns in exposed coatings on opposite sides of a transparent substrate.

Figure 1:
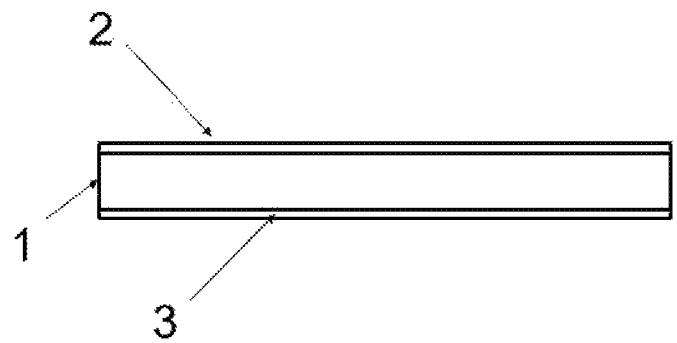
FIG. 1 show a cross-section of a known substrate with a coating on each side thereof.

FIG. 1 shows a cross section of a substrate 1 used for a typical two-layer projected capacitive touch panel. The substrate 1 is transparent and can be rigid and made of glass or other inorganic transparent material (eg silica) or can be flexible and made of polymer such as Polyester (PET), polycarbonate (PC) or acrylic (PMMA). The thickness of the substrate 1 is generally a fraction of a mm although it is of a thickness such that the substrate can be mounted on a stage for processing. As mentioned above, the substrate is preferably at least 0.05 mm thick but typically less than 0.5 mm thick, and in a preferred case less than 0.2 mm thick. Thin layers 2 and 3 of a material that is both transparent and electrically conducting are applied to both sides of the substrate 1. These layers 2 and 3 are usually made of an inorganic oxide material such as Indium Tin Oxide (ITO), Tin Oxide ($SnO_2$), Zinc Oxide (ZnO) or other oxide in which case they are referred to as TCOs (transparent conductive oxides). Such materials may be applied by physical vapour deposition (PVD) but other methods may also be used. Other transparent conducting layers based on organic materials or nano-particle materials can also be used. Such layers are typically applied by printing type processes but other methods may again be used. The generic term transparent conducting (TC) material is used to denote all suitable transparent conductors. Typical TC layer thicknesses are in the range of 30 nm to a few 100 nm. The sheet resistances of TC layers used in touch panels usually lie in the range of 10Ω per square to several 100Ω per square. TC optical transmission across the visible region is generally greater than 85% and often greater than 90%.

Figures 2A, 2B:
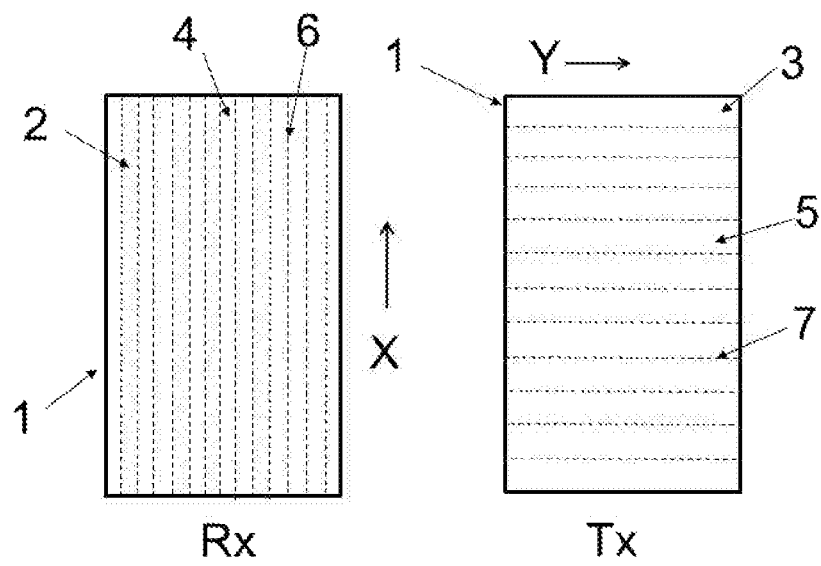
FIGS. 2A and 2B are schematic diagrams of known electrode patterns that may typically be provided in the coatings on each side of the substrate.

FIG. 2A and B show the type of electrode structures used to form a common type of two layer projected capacitance touch panel. The two diagrams show plan views of the opposite faces of the transparent substrate 1. The TC layers 2 & 3 on opposite sides are divided into several separate linear parallel electrodes 4 & 5 by breaks 6 & 7 in the TC layer that penetrate to the substrate surface. These electrically isolating breaks can be made by lithographic processes involving chemical or plasma etching or preferably are made by laser scribing. The breaks are ideally sufficiently narrow that they are indiscernible to the eye. Electrodes on one face of the substrate run in the orthogonal direction to those on the opposite face to form sets of transmit electrodes (Tx) and receive electrodes (Rx) of a capacitive sensor. Touch panels that are to be used in a hand held devices are generally rectangular and usually have sizes up to about 80×120 mm. Touch panels for notebook PCs are substantially larger being typically up to 250 mm×150 mm in size. Electrode widths in the TC layer vary from around 1 mm for the Rx electrodes to many mm for the Tx electrodes. Electrode layouts may be more complex than shown in FIG. 2 but in general they always consist of some type of orthogonal X-Y array.

It is of course necessary to provide electrical connections to at least one end of each X electrode and each Y electrode in order to monitor the changes in capacitance between electrodes induced by a touch event on the surface of the touch panel but such electrode connection methods are well known so will not be described further.

Figure 3:
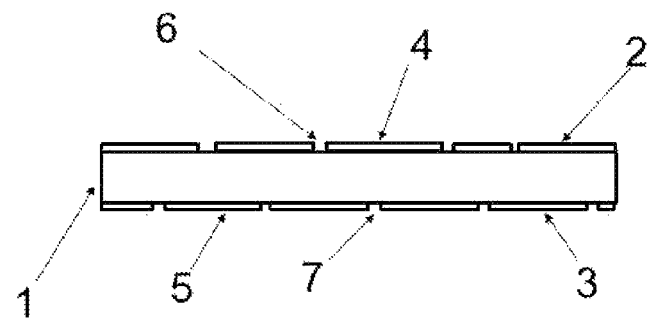
FIG. 3 is a cross-section of a known substrate such as that shown in FIG. 1 after formation of electrode patterns in the coatings.

FIG. 3 shows a cross-section of the substrate for the capacitive sensor after electrode formation. Electrically isolating grooves 6 are formed in first TC layer 2 to create isolating electrode bands 4. In the same way, electrically isolating grooves 7 are formed in the second TC layer 3 to create isolating electrode bands 5 which generally run orthogonally to those on the first TC layer 2.

To make such two-layer sensors reliably on thin substrates by lithographic methods requires many process steps involving resist application, pattern exposure, resist development, TC etching and resist stripping for both sides of the substrate. To simplify these processes, lasers are frequently used to directly form the grooves in the TC layers by ablation of the TC material from the substrate. On substrates having a single TC layer on one side, such laser ablation processes work very well but with substrates having the same TC layer on both sides selective patterning of the first TC layer without the first side laser causing damage to the second TC layer (or selective patterning of the second TC layer without causing damage to the first TC layer) is difficult unless the substrate is relatively thick (eg >0.7 mm) or the laser wavelength is short (eg 355 nm or less). Both of these requirements are undesirable—thick sensors add unacceptable weight and thickness to the device into which the sensor is to be incorporated and use of short wavelength lasers is expensive and is likely to lead to damage to the substrate surface.

Hence, as mentioned above, there is need for a reliable laser based process for selectively forming the Tx and Rx electrode structures in exposed coatings on opposite sides of such thin transparent substrates.

Figure 4:
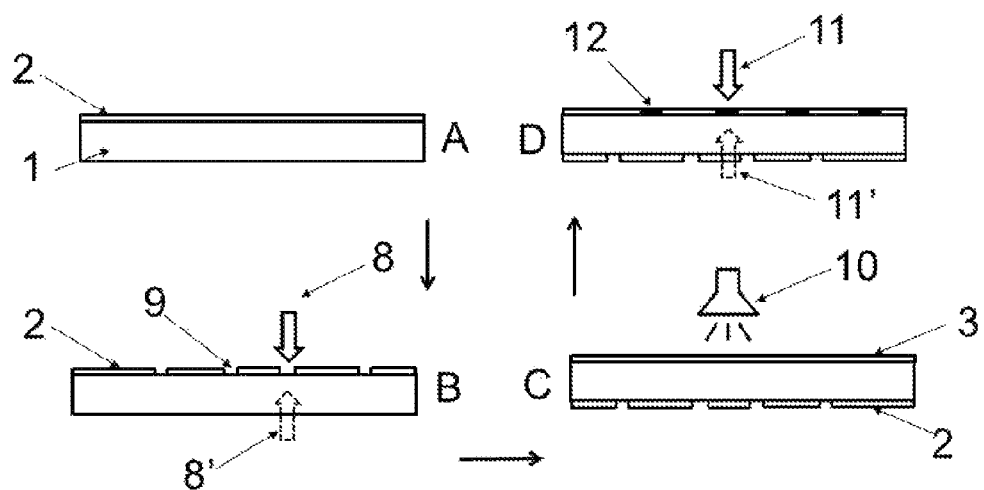
FIGS. 4A-4D are cross-sections of a substrate illustrating the stages in the formation of patterns in coatings on opposite sides thereof according to an embodiment of the invention.

FIG. 4 shows the process steps in a preferred method of the invention. The starting point is a thin substrate 1 coated on first side with a first TC layer 2 as shown in FIG. 4A. As indicated above, to form a thin sensor, the substrate also needs to be thin. Preferably the substrate has a thickness of 0.5 mm or less, and most preferably of 0.2 mm or less.

The first TC layer is formed of a material having a relatively high laser ablation threshold energy density, eg greater than about 0.5 J/cm$^2$. An appropriate TC material for this later is Indium Tin Oxide (ITO). Such a TC material is readily applied to glass and plastic substrates by PVD processes such as sputtering. For ITO and other TCOs deposited on glass or plastic substrates, the ablation threshold energy density is usually in the range 0.5 to 0.7 J/cm$^2$. The first TC layer is typically applied before the substrate is mounted on a stage for laser processing but may also be applied whilst the substrate is supported on the stage.

FIG. 4B shows the next step where a beam 8 from a pulsed laser is used to form electrically isolating grooves in the first TC layer 2 by a process of laser ablation to create the required electrode structure on the first side of the substrate 1. Pulsed diode-pumped solid state (DPSS) lasers operating in the infra-red (IR) region, eg at a wavelength around 1064 nm are preferred for removing ITO or similar TC materials from glass and plastic substrates. The laser beam 8 can be focussed directly onto the first TC layer 2 on the first side of the substrate 1 or, alternatively, a beam 8' can be directed towards the second side of the substrate 1 and pass through the substrate 1 to interact with first TC layer 2 from the rear. The first laser beam has an energy density sufficient to ablate the first coating, eg an energy density of 0.5 J/cm$^2$ or higher for the first coating described above.

FIG. 4C shows the next step where the substrate 1 is inverted and a second TC material is applied to the second side from solution, eg by a spray process using spray head 10. The second TC material has a laser energy density threshold for either ablation of the TC material or for disruption of the TC material such that it no longer conducts that is lower than the laser energy density threshold for ablation of the first TC. Typically, the laser energy density threshold for ablation of the TC material or for disruption of the TC material would be less than about 0.5 J/cm$^2$. Thus, the laser ablation or modification energy density threshold for the second transparent coating is lower than that for the first transparent coating. The difference between the thresholds for the two coatings should be sufficient to enable a pattern to be formed in the second coating by laser ablation or modification without causing appreciable damage to the first coating. In practice a difference of at least 20% of the higher energy density is desirable and preferably a difference of at least 40%.

Suitable materials for the second TC are nanomaterial such as silver or other metal nano-wires (NWs), carbon nanotubes (CNTs), carbon nano-buds (CNBs), graphene, or other nanoparticles. Other TC materials, such as organic layers (eg poly (3,4-ethylenedioxythiophene or PEDOT), having a suitably low energy density for ablation or modification can also be used.

FIG. 4D shows the final step where a laser beam 11 from a second laser is used to create electrically isolating regions 12 in the second TC layer 3. Electrical isolation can be by ablative removal of the second TC along the beam path or by disruption of the nano-particles in the TC layer 3 to electrically isolate the TC material on one side of the laser path from that on the other side. The second laser is ideally of similar type and wavelength to the first laser but alternative laser types, such as a DPSS or fibre laser operating in the visible region (eg at or around 532 nm), can also be used. The laser beam 11 can be focussed directly onto the second TC layer 3 on the second side of the substrate 1 or, alternatively, a beam 11' can be directed towards the first side of the substrate 1 and pass through the first TC layer 2 and the substrate 1 to interact with second TC layer 3 from the rear. The second laser beam has an energy density sufficient to ablate (or modify) the second coating but not high enough to cause appreciable damage to the first coating, eg an energy density of 0.5 J/cm$^2$ or less for the first and second coatings described above.

As shown in FIGS. 4B and 4D, the outer faces of both of the TC layers 2, 3 are exposed during the laser ablation steps, ie neither is covered by a further layer.

A preferred arrangement uses an IR pulsed laser for patterning both first and second TCs.

Another preferred arrangement uses an IR laser for patterning the first TC layer on the first side of the substrate and a pulsed laser operating in the visible region (eg 532 nm or 515 nm) to pattern the second TC layer on the second side.

Other materials besides those mentioned above may me used for forming the first and second coatings so long as they have sufficiently different laser ablation/modification threshold energy densities. Generally, both layers would be formed of different types of material (as in the examples described) but in some cases they may be formed of similar materials (eg both may be formed of nanomaterials but with different laser ablation/modification threshold energy densities).

Figure 5:
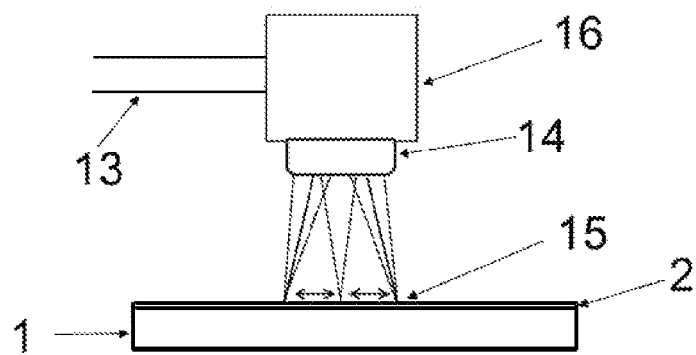
FIG. 5 is a side view of one form of apparatus for use in carrying out a method according to the invention.

FIG. 5 shows a side view of one form of apparatus for carrying out the method described to form the breaks in the first and second TC layers to create the electrode structures therein. Laser beam 13 is focused by lens 14 to a small spot 15 on the surface of the substrate to remove material directly by ablation or modify the TC material. As indicated by the double-headed arrows in the figure, the beam is moved over an area of the substrate by means of 2D scanner unit 16 to create the required groove pattern to define the Tx or Rx electrodes.

Figure 6:
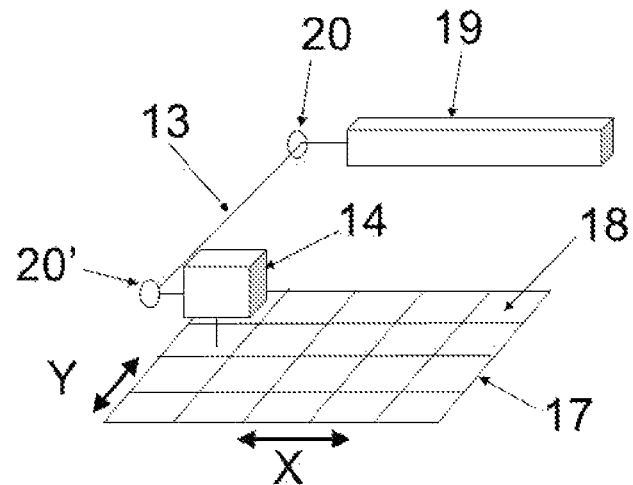
FIG. 6 is a schematic perspective view illustrating one way of moving such apparatus relative to a substrate.

FIG. 6 shows how a glass or polymer sheet substrate 17 can be processed to make a multiplicity of capacitive touch panels using the laser arrangement shown in FIG. 5. The substrate 17 contains many touch panels 18 (in this case an array of twenty) and is mounted on XY stages. The substrate 17 is coated all over with a first TC layer on the top side. Pulsed laser 19 emits beam 13 which is directed to scanner and lens unit 14 via mirrors 20 and 20'. The substrate 17 is positioned on the stages such that one of the panels 18 is under the scanner and the laser and scanner are operated to pattern the first TC layer over the whole or part of that panel 18. The stages then step in X and Y to move the substrate so that either another area of the panel 18 or another panel 18 is positioned under the scanner. This operation proceeds until all the sensor panels on the substrate 1 have been patterned. The substrate 1 is then removed and a second TC is sprayed onto the second side thereof following which the substrate 1 is replaced on the XY stages again and aligned to appropriate fiducial marks so that first side and second side patterns register with each other. The second side TC is then laser patterned in the same "step and scan" mode as the first side but using a lower pulsed laser energy density (as described above) so that this process causes no appreciable damage to the first TC layer formed in the preceding step.

FIG. 7 shows an alternative arrangement for making such a dual layer sensor when the substrate is in the form of a continuous web. Web material 21 with a TC layer on the top side thereof is progressively moved in the X direction from a first drum 22 to a second drum 23. Movement of web 21 along the X direction may be continuous or intermittent. For accuracy in motion along X, it is desirable to suck down a length of the web material 21 onto a chuck 24 which is moved on a linear stage. Pulsed laser 19 emits beam 13 which is directed to scanner and lens unit 14 via mirrors 20 and 20'. The scanner 14 is mounted on a linear stage that so that it can be moved in the Y direction. The scanner and substrate on the chuck are positioned by means of the X and Y stages such that one of the sensor panels 18 is positioned under the scanner and the laser and scanner are operated to pattern the first TC layer over the whole or part of that panel area. The scanner then moves in the Y direction so that either another area of the panel or another sensor panel is positioned under the scanner. This operation proceeds until all the sensor panels on the substrate have been patterned across the web width following which the web is advanced in the X direction to expose new areas of the web to be patterned. An alternative way of achieving relative motion of the scanner with respect to the web is possible if the scanner can move in both X and Y whilst the web is held stationary. These steps are then repeated after the second TC layer is applied to the second side of the substrate to form the second pattern therein.

FIG. 8A shows a schematic side view of apparatus similar to that shown in FIG. 7. A web of material 31 comprising a substrate with a first TC layer on a first side thereof is unwound from a first drum 32. A first laser is used to pattern the first TC layer (on the underside of the unwound web), a second TC layer is applied, eg by spraying, to the second (upper) side of the web of material, a second laser is used to pattern the second TC layer and the web of material then rewound onto a second drum 33. During both the laser patterning steps the web material is mounted to a linear stage as described in relation to FIG. 7 (or mounted to a chuck and the laser moved in the X and Y directions).

FIG. 8B shows a schematic side view of apparatus similar to that of FIG. 8A in which the second TC layer is applied by means of a transfer film (described further below in relation to FIGS. 9 and 10). FIG. 8B shows a web 34 of material unwound from a first drum 35 and rewound on a second drum 36 after a transfer film 37 is applied thereto from laminating rollers 38 and 39.

Figure 9:
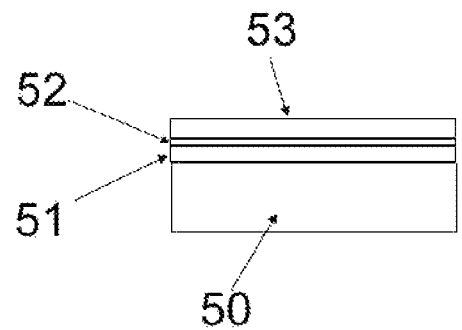
FIGS. 9 is cross-sectional view of a transfer film which may be used in some embodiments of the invention.

FIG. 9 shows a cross-section of a transfer film which can be used to apply the second TC layer to the substrate. The transfer film comprises a carrier film 50, an adhesive layer 51 (typically around 5 microns thick) thereon a nanowire (NW) layer 52 thereon which is typically less than 100 nm in thickness and, finally, a removable protective layer 53, eg of a suitable plastic film. A suitable transfer film is that available from Hitachi Chemical.

Such transfer films enable the NW layer 52 to be applied to a substrate without the need for a vacuum process like vapour deposition. Instead, the NW layer 52 (with the adhesive layer 51 and protective layer 53) is removed from the carrier film 50 and then applied directly to the substrate (using the adhesive layer 51 to affix the NW layer thereto) following which the protective layer 53 can be peeled off.

The adhesive layer thus forms a thin dielectric layer between the substrate and the NW layer and the NW layer can then be patterned by laser ablation as in the methods described above.

Figure 10A:
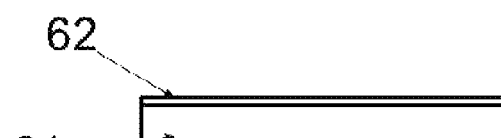
FIG. 10A-10D are cross-sections of a substrate illustrating the stages in the formation of patterns in coatings on opposite sides thereof in a method using the transfer film of FIG. 9.
Figure 10B:
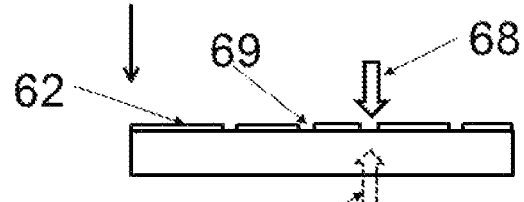

The steps of this modified process are illustrated in FIGS. 10A-10D. FIG. 10A shows a substrate 61 with a first TC layer 62 provided on a first face of the substrate 61. Grooves 69 are then formed in the TC layer 62 by laser ablation either by a laser beam 68 from above or by means of a laser beam 68' that passes through the substrate 61 from beneath as shown in FIG. 10B.

Figure 10C:

A second TC layer 65 in the form of a NW layer is then provided on the second face of the substrate by means of a transfer film as described above, the second TC layer 65 being secured to the second face via a layer 64 of adhesive as shown in FIG. 10C.

Figure 10D:
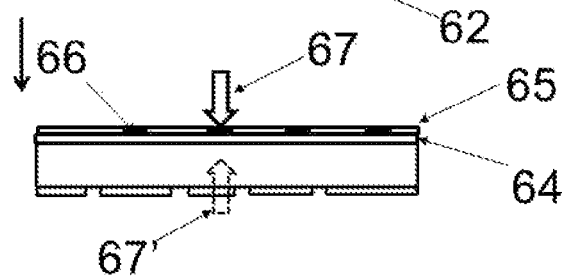

Finally, as shown in FIG. 10D, grooves or modified strips are formed in the NW layer 65 by laser ablation either by a laser beam 67 from above or by means of a laser beam 67' that passes through the substrate 61 (and first TC layer and adhesive layer 64) from beneath.

Figure 11:
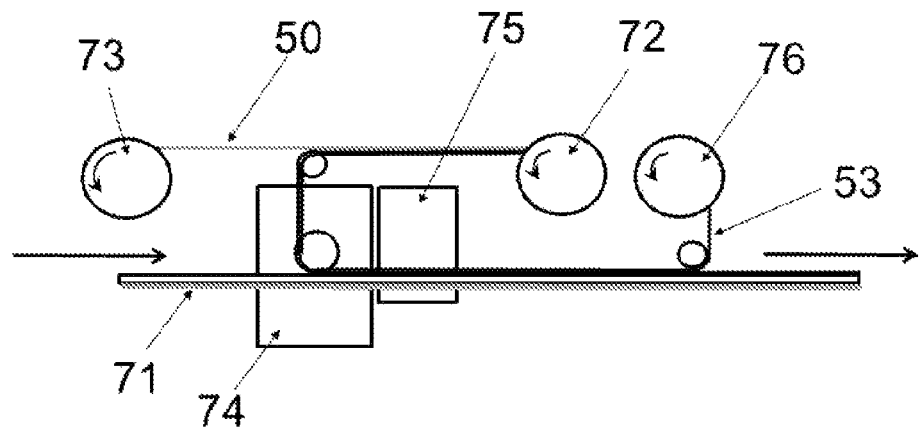
FIG. 11 is schematic diagram of apparatus used to perform the stages shown in FIGS. 10A-10D.

FIG. 11 illustrates in more detail a method for applying the transfer film to the substrate when carried out on a reel-to-reel set up (similar to that shown in FIG. 8B). In this case, a thin film glass (TFG) or PET substrate 71 is used with a first TC layer thereon formed of indium tin oxide (ITO). The TFG layer may typically have a thickness of about 0.1 mm. The ITO layer is on the underside of the TFG film and is laser patterned to form the required lower electrode structures (not shown in FIG. 11). A transfer film (such as that shown in FIG. 9) is unwound from a drum 72 and the carrier film 50 removed therefrom and rewound onto a drum 73. The transfer film them passes through a laminator 74 to be applied to the second face of the substrate 71 and this then passes through a UV curing stage to cure the adhesive 51 which affixes the NW layer 52 to the substrate 71. The protective film 53 is then removed from the NW layer and wound onto a drum 76. The NW layer is then laser patterned to form the upper electrode structures (not shown in FIG. 11).

The resultant laminate thus comprises a TFG (or PET) substrate, a first TC layer of ITO on a first face thereof and a second TC layer in the form of a NW layer affixed to the second face thereof via an adhesive layer. Laser patterning of the first TC layer is carried out before the substrate passes through the lamination stage and laser patterning of the second TC layer is carried out after removal of the protective layer 53.

Figure 12:
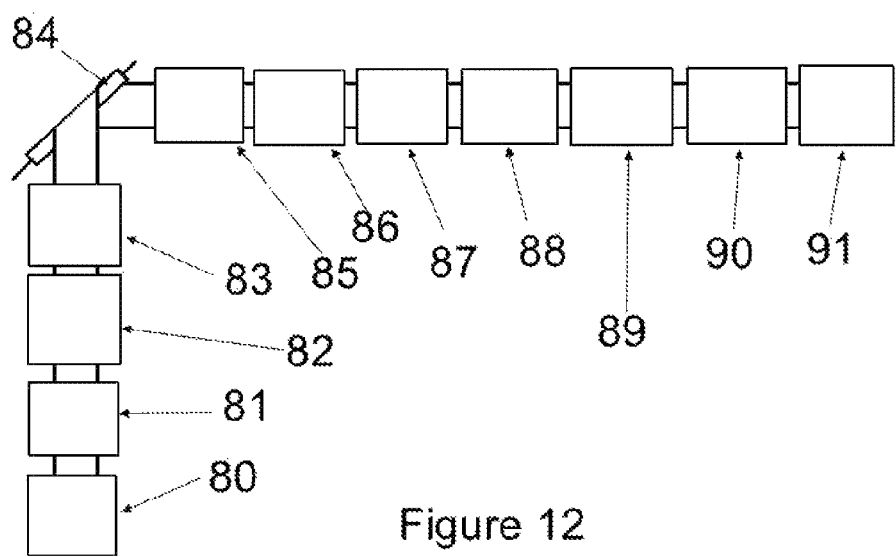
FIG. 12 is a schematic diagram of a production line for carrying out a method similar to that illustrated in FIG. 4.

FIG. 12 is a schematic illustration of a production line for carrying out a method involving stages similar to those shown in FIG. 4. Step 80—a substrate with a first TC layer applied to a first face thereof is unwound from a first drum, step 81—an ink jet or screen printer applies metal (usually of Ag) to the first TC layer in particular areas to form sensor connection pads and busbars, step 82—the Ag ink is cured in a curing stage, step 83—a length of the substrate is then located on a first chuck whilst laser patterning of the first TC layer/Ag is carried out, the substrate is then inverted by roller 84, step 85—NW material is sprayed onto the second face of the substrate to form the second TC layer, step 86—the NW layer is cured, step 87—an ink jet or screen printer applies Ag pads or busbar structures to the second TC layer, step 88—the Ag ink is cured, step 89—a length of the substrate is then located on a second chuck whilst laser patterning of the second TC layer/Ag is carried out, step 90—sensor parts are cut from the substrate and transferred to a conveyor, stack or cassette (cutting may be by mechanical means but laser cutting is preferred), step 91—the substrate is rewound onto a second drum. Step 90 may be performed on another, separate tool if required and roller 84 may be replaced by a rewind unit followed by a further unwind unit.

Figure 13:
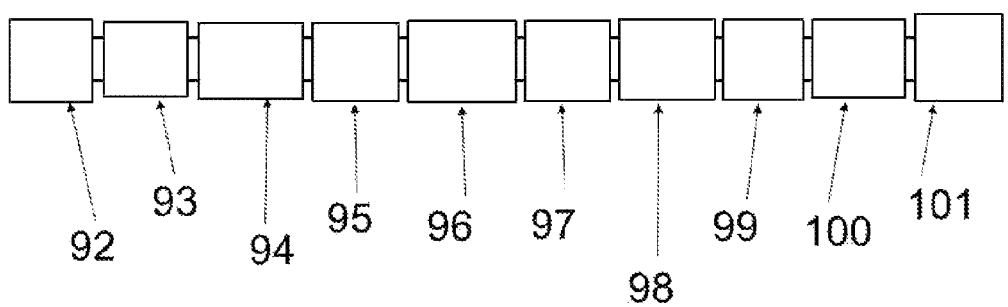
FIG. 13 is a schematic diagram of a production line for carrying out a method similar to that illustrated in FIG. 10.

FIG. 13 is a schematic illustration of a production line for carrying out a method involving stages similar to those shown in FIG. 10. Step 92—a substrate with a first TC applied to the first face thereof is unwound from a first drum, step 93—an ink jet or screen printer applies metal (usually of Ag) on top of the first TC (typically ITO) in particular areas to form sensor connection pads and busbars, step 94—the Ag ink is cured in a curing stage, step 95—a length of the substrate is then located on a first chuck whilst laser patterning of the first TC layer/Ag is carried out, step 96—a NW layer is applied to the second face by means of a transfer film using apparatus such as that shown in FIG. 11, step 97—an ink jet or screen printer applies Ag pads or busbar structures to the NW layer, step 98—the Ag ink is cured, step 99—a length of the substrate is then located on a second chuck whilst laser patterning of the second TC layer/Ag is carried out, step 100—sensor parts are cut from the substrate and transferred to a conveyor, stack or cassette (cutting may be by mechanical means but laser cutting is preferred), step 101—the substrate is rewound onto a second drum.

The method described above for making a two-layer capacitive touch sensor on a single thin transparent substrate made of glass or plastic has the following key features:
1) a first transparent conducting (TC) material is provided on a first side of substrate, the first TC material having relatively high laser ablation threshold energy density
2) a first pulsed laser is used to pattern the first TC layer by ablative TC material removal to form Tx or Rx electrodes of the sensor by a laser focussed directly onto the first TC layer from said first side or a by a laser directed at the second side of substrate, through substrate and onto the first TC layer on first side from the rear
3) a layer of second TC material is sprayed onto (or otherwise applied to) a second side of the substrate, the second TC material preferably being a nanomaterial and having a relatively low laser threshold energy density for ablative removal or modification
4) a second pulsed laser is used to ablate or modify a second TC layer to form Tx or Rx electrodes of the sensor without causing any appreciable damage to first TC layer, the second laser having similar or different wavelength to the first laser, the second laser being focussed directly onto the second TC layer on the second side or the second laser being directed from the first side of the substrate through the first TC layer, and passing through substrate to interact with the second TC layer on the second side from the rear.
5) both the first and second transparent coatings are exposed, ie not covered by further layers or coatings, when the first and second laser are used to form the electrode structures therein The method described above thus provide an improved method of fabricating a "cover integrated" two-layer capacitive touch sensor panel which enables direct laser writing of electrode patterns on both sides of a thin substrate in place of chemical etching processes so reducing or avoiding the problems described above and thereby simplifying the fabrication of such panels and reducing their cost.

The invention claimed is:

1. A method of forming patterns in coatings on opposite sides of a transparent substrate, the substrate having first and second faces on opposite sides thereof, by direct write laser patterning comprising the steps:
   a) providing a first transparent coating on the first side of the substrate, the first coating being formed of a material having a relatively high laser ablation threshold energy density;
   b) mounting the substrate on a stage or locating the substrate on a chuck,
   c) using a first laser beam to form a first pattern in the first transparent coating by laser ablation;
   d) providing a second transparent coating on the second side of the substrate after formation of said first pattern, the second coating being formed of a material having a relatively low laser ablation or modification threshold energy density;
   e) using a second laser beam to form a second pattern in the second transparent coating by laser ablation or modification, the energy density of the second laser beam being lower than that of the first laser beam such that ablation of the second transparent coating is carried out without causing appreciable damage to the first transparent coating.

2. The method as claimed in claim 1, in which the substrate has a thickness of at least 0.05 mm and less than 0.5 mm, and preferably less than 0.2 mm.

3. The method as claimed in claim 1, in which the first coating has an laser ablation threshold energy density of at least 0.5 J/cm$^2$.

4. The method as claimed in claim 1, in which the first coating comprises an inorganic oxide material.

5. The method as claimed in claim 1, in which the first laser beam has an energy density of 0.5 J/cm$^2$ or higher.

6. The method as claimed in claim 1, in which the first laser beam is a pulsed laser beam having a wavelength in the infra-red region.

7. The method as claimed in claim 1, in which the first laser beam is directed from the second side of the substrate through the substrate to the first coating on the first side of the substrate.

8. The method as claimed in claim 1, in which the second coating has an laser ablation or modification threshold energy density of less than 0.5 J/cm$^2$.

9. The method as claimed in claim 1, in which the second coating comprises a nanomaterial.

10. The method as claimed in claim 9, in which the nanomaterial is selected from the following: metal nano-wires, carbon nanotubes, carbon nano-buds, graphene and other nano-particles.

11. The method as claimed in claim 1, in which the second laser beam has an energy density of 0.5 J/cm$^2$ or lower.

12. The method as claimed in claim 1, in which the second laser beam is a pulsed laser beam having a wavelength similar to that of the first laser beam.

13. The method as claimed in claim 1, in which the second laser beam is a pulsed laser beam having a wavelength different to that of the first laser beam.

14. The method as claimed in claim 1, in which the second laser beam is directed from the first side of the substrate through the first coating and the substrate to the second coating on the second side of the substrate.

15. The method as claimed in claim 1, in which the first and/or second patterns are formed by a series of grooves through the first and/or second coatings which electrically isolate the parts of the coating on either side of the groove.

16. The method as claimed in claim 1, in which the second pattern comprises one or more lines of modified material in the second coating which electrically isolate parts of the coating on either side of the line.

17. The method as claimed in claim 1, in which the first and second patterns form Tx and Rx electrodes of the sensor.

18. The method as claimed in claim 1, in which the first transparent coating is applied to the substrate prior to the substrate being mounted on a stage or located on a chuck.

19. The method as claimed in claim 1, in which the substrate is in the form of a continuous web which is unwound from a first drum prior to laser patterning of the first and second transparent coatings and then re-wound onto a second drum.

20. The method as claimed in claim 1, in which the second transparent coating is applied to the second face of the substrate by means of a transfer film.

21. The method as claimed in claim 20, which includes a curing step for curing an adhesive layer which affixes the second transparent coating to the second face of the substrate.

22. A product formed by a method as claimed in claim 1, comprising a transparent substrate having first and second patterns formed in first and second transparent electrically conductive coatings on first and second sides thereof by direct write laser patterning, the first and second coatings being formed of different materials, the first coating being formed of a material having a relatively high laser ablation threshold energy density and the second coating being formed of a material having a relatively low laser ablation or modification threshold energy density.

23. The product as claimed in claim 22, in which the first coating comprises an inorganic oxide material and the second coating comprises a nanomaterial.

24. The product as claimed in claim 23, in which the first coating comprises indium tin oxide (ITO) and the second coating comprises a silver nanowire material.

25. The product as claimed in claim 22, forming part of a two-layer capacitive touch sensor.

26. An apparatus for forming patterns in first and second transparent coatings provided on opposite sides of a transparent substrate by direct write laser patterning, the substrate having first and second sides on opposite faces thereof, the apparatus comprising:
a stage on which the substrate can be mounted or a chuck on which the substrate can be located;
a first laser source arranged to provide a first laser beam for forming a first pattern in the first transparent coating on the first side of the substrate by laser ablation; and
a second laser source arranged to provide a second laser beam to form a second pattern in the second transparent coating on the second side of the substrate by laser ablation or modification,
the energy density of the second laser beam being lower than that of the first laser beam such that ablation of the second transparent coating can be carried out without causing appreciable damage to the first transparent coating.

27. The apparatus as claimed in claim 26, in which the substrate is in the form of a continuous web, the apparatus comprising a first drum from which the continuous web is unwound before the first laser pattern is formed and a second drum on which the continuous web is re-wound after the second laser pattern is formed.

28. The apparatus as claimed in claim 27, comprising a first chuck onto which lengths of the continuous web can be located whilst the first laser pattern is formed and a second chuck onto which lengths of the continuous web can be located whilst the second laser pattern is formed.

29. The apparatus as claimed in claim 28, in combination with a transparent substrate having a first transparent coating on a first side thereof, the first coating being formed of a material having a relatively high laser ablation threshold energy density and second transparent coating on a second side of the substrate, the second coating being formed of a material having a relatively low laser ablation or modification threshold energy density.

30. The use of an apparatus as claimed in claim 26 to carry out a method of forming patterns in coatings on opposite sides of a transparent substrate, the substrate having first and second faces on opposite sides thereof, by direct write laser patterning comprising the steps:
a) providing a first transparent coating on the first side of the substrate, the first coating being formed of a material having a relatively high laser ablation threshold energy density;
b) mounting the substrate on a stage or locating the substrate on a chuck,
c) using a first laser beam to form a first pattern in the first transparent coating by laser ablation;
d) providing a second transparent coating on the second side of the substrate after formation of said first pattern, the second coating being formed of a material having a relatively low laser ablation or modification threshold energy density;
e) using a second laser beam to form a second pattern in the second transparent coating by laser ablation or modification, the energy density of the second laser beam being lower than that of the first laser beam such that ablation of the second transparent coating is carried out without causing appreciable damage to the first transparent coating.

* * * * *